United States Patent [19]

Ikeya

[11] Patent Number: 4,846,704
[45] Date of Patent: Jul. 11, 1989

[54] TEST SOCKET WITH IMPROVED CONTACT ENGAGEMENT

[75] Inventor: Kiyokazu Ikeya, Shizuoka, Japan

[73] Assignee: Texas Instruments Incorporated, Dallas, Tex.

[21] Appl. No.: 190,278

[22] Filed: May 4, 1988

[30] Foreign Application Priority Data

Jun. 9, 1987 [JP] Japan ................. 62-144526

[51] Int. Cl.⁴ .......... H01R 9/09; H01R 4/26; H01R 13/629
[52] U.S. Cl. ................. 439/72; 439/73; 439/267; 439/331; 439/387; 439/439
[58] Field of Search ........... 439/70, 72, 73, 330, 439/331, 387, 436–439, 267

[56] References Cited

U.S. PATENT DOCUMENTS

| | | | |
|---|---|---|---|
| 3,344,316 | 9/1972 | Stelmak | 439/387 X |
| 3,663,920 | 5/1972 | Lapham et al. | 439/387 X |
| 3,753,211 | 8/1973 | Pauza et al. | 439/387 X |
| 3,876,896 | 4/1975 | Albrecht et al. | 439/387 X |
| 4,530,557 | 7/1985 | Katsube et al. | 439/330 X |
| 4,715,823 | 12/1987 | Ezura et al. | 439/70 X |

Primary Examiner—Steven C. Bishop
Attorney, Agent, or Firm—James P. McAndrews; John A. Haug; Melvin Sharp

[57] ABSTRACT

A test socket has movable contact elements blanked from sheet metal to provide each element with a mounting leg part, a contact part at an edge of the blanked sheet metal, and a resilient curved part between the leg and contact parts permitting the contact part to be moved into and out of engagement with terminals of an IC unit to be tested in the socket and has a plurality of projections formed in side-by-side relation to each other in the edge of the sheet metal at the contact part for improving the making and breaking of electrical connection to the IC unit terminal.

2 Claims, 6 Drawing Sheets

TEST SOCKET WITH IMPROVED CONTACT ENGAGEMENT

BACKGROUND OF THE INVENTION

This invention relates to a socket having a contact element to be electrically connected to an electrical components such as a terminal of a semiconductor integrated circuit (hereinafter referred to as an IC chip), and relates more particularly to a contact which makes such electrical connection in a resilient or elastically compressed manner.

In conventional practice, IC chips have been placed in a heating oven or furnace to be subjected to a heat resistance test for determining whether the chips are satisfactory or not. The IC chips are inserted into known test sockets to engage chip terminals with socket contacts to connect the chips in test circuits during the noted tests and it is found that the engagement of the socket contacts with the chip terminals during the tests results in less than fully reliable connection and the chip terminal may be marred by its engagement with the socket contact. These difficulties occur not only during such heat resistance tests but also during other long duration engagements of the socket contacts with the chip terminals.

BRIEF SUMMARY OF THE INVENTION

It is an object of this invention to provide a socket having improved contact engagement characteristics; to provide such a socket which is highly reliable and durable and adapted to make secure electrical contact with terminals of electrical components despite repeated usage or long term usage; and to provide such a socket particularly suited for use as a test socket for heat resistance testing of IC chips.

DESCRIPTION OF THE DRAWINGS

Other objects, advantages and details of the novel and improved socket of this invention appear in the following detailed description of preferred embodiments of the invention, the detailed description referring to the drawings in which.

DESCRIPTION OF PREFERRED EMBODIMENTS

Figure 1A:
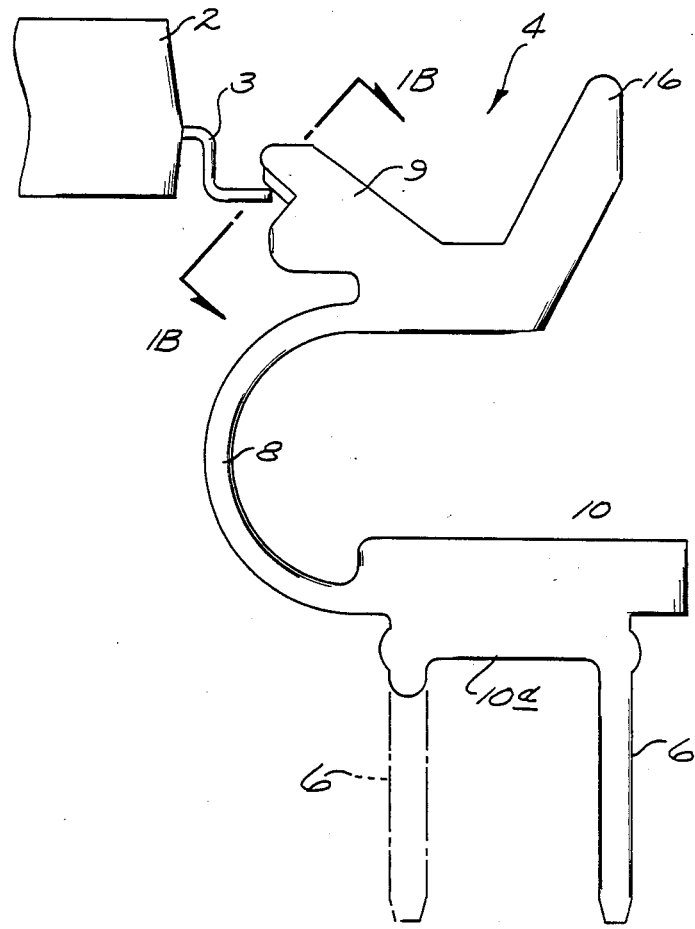
FIG. 1A is a schematic side elevation view of a contact used in the socket of this invention.

IC chips have been mounted in test sockets and placed in a heating furnace for testing the IC sockets (such as a heat resistant test), thereby determining whether the said chips are satisfactory or dissatisfactory.

FIGS. 6-9 show a socket conventionally used for the installation of an IC chip unit to be used in such a test. In the main body 37 of this socket 31, securing of contacts 34 in the body is arranged in such a manner that a large number of the flat plate-like contacts or contact elements 34 may face an installation recess or surface area 48 where an IC chip 2 is to be installed in the socket. In the case of this socket 31, a large number of plate contact elements 34 are adapted to be connected with Z-shaped pins or terminals 3 on the chip 2 so that the chip can be inserted into a test circuit (indicated at 5 in FIG. 6) upon installation of the IC chip at the recess 48, and the IC chip 2 is inserted into the space 48 from above in such a manner as to be sandwiched between contacts 34 disposed around the sides of the recess as will be understood.

That is, each contact element 34 is fixed to the base body 37 in such a fashion that each lead leg 36 may be extended downward and has an elastic curved part 38 which is bent somewhat outwardly above this fixed part. At the upper end of this curved part, moreover, there is provided a compressive part 39 which is pressed against the IC chip by the elasticity of the aforementioned curved part by sandwiching the IC chip 2 and a trigger part 46 between the socket body 37 and a cover 43, the trigger part 46 being located at a position approximately at the same height as the compressive part 39 and being copressed downward by the lower edge 43a of the cover 43.

It is mentioned in this connection that the above cover 43 may be placed from above as compared with the main body 37 and engaged with the main body 37 by means of latch or engagement claw (which is omitted in the drawing).

In addition, a lead leg part 36 is inserted into a lead hole of a print substrate 7 that is connected with the test circuit 5 and is fixed therein by means of soldering or the like.

Figure 6:
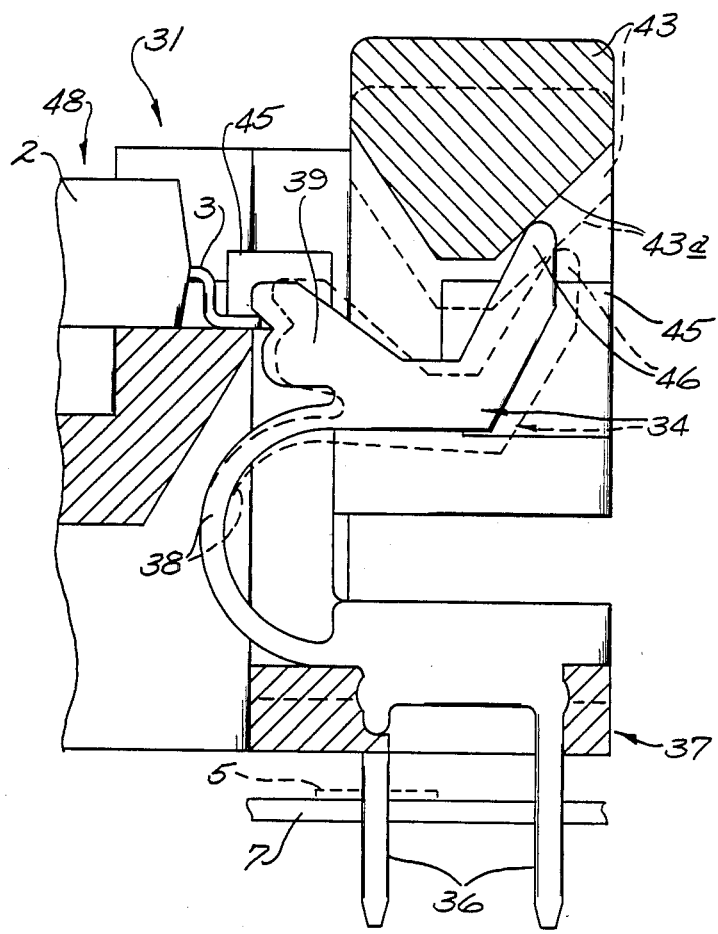
FIG. 6 is a partial section view similar to FIG. 2 illustrating a prior art socket.

According to such a socket 31, when the cover 43 is pressed downward, the lower edge 43a thereof compresses the trigger part 46 of the contact element 34, with a result that the contact element 34 itself effects an elastic or resilient transformation or movement as shown by the broken line in FIG. 6. Inasmuch as this transformation is produced outwardly from positions surrounding the recess space 48, IC chip 2 is easily inserted when the socket cover is in this state. That is, the IC insertion can take place easily because of the aforementioned elastic transformation.

If the force applied against the cover 43 is removed thereafter, the contact element 34 resiliently returns or attempts to be restored from the state indicated by the broken line to the original shape indicated by the solid line. Because of this restoring strength, the compressive part 39 of the contact element 34 effects an electrical contact with the terminals 3 of the IC chip 2 with a result that the IC chip 2 is installed and retained inside the socket 31.

In connection with the above, the compressive part 39 elastically contacts the Z-shaped pin 3 of the IC chip 2, with a consequence that the IC chip 2 will be connected with the test circuit through the contact element 34.

When the IC chip 2 is to be removed, the cover 43 is pressed downward once again and the contact element 34 is elastically deformed as indicated by the broken line to release the IC chip from the recess 48.

The following advantages can be achieved by constructing the socket as described above:

(1) The opening and closing of the cover 43 can be effected by an automatic test unit or equipment;

(2) The terminal or lead 3 of the semiconductor IC chip does not hide itself under the cover 43, with a result that it becomes easier to confirm the contact state between the leads 3 and the contact elements 34 by naked eye; and (3) The main socket body 37 does not have to become excessively large as compared with the IC chip.

However, the socket shown in FIG. 6 is subject to the following deficiencies, despite the fact that it has such advantages as described above. This problem will be explained on the basis of FIGS. 7-9.

Figure 7A:
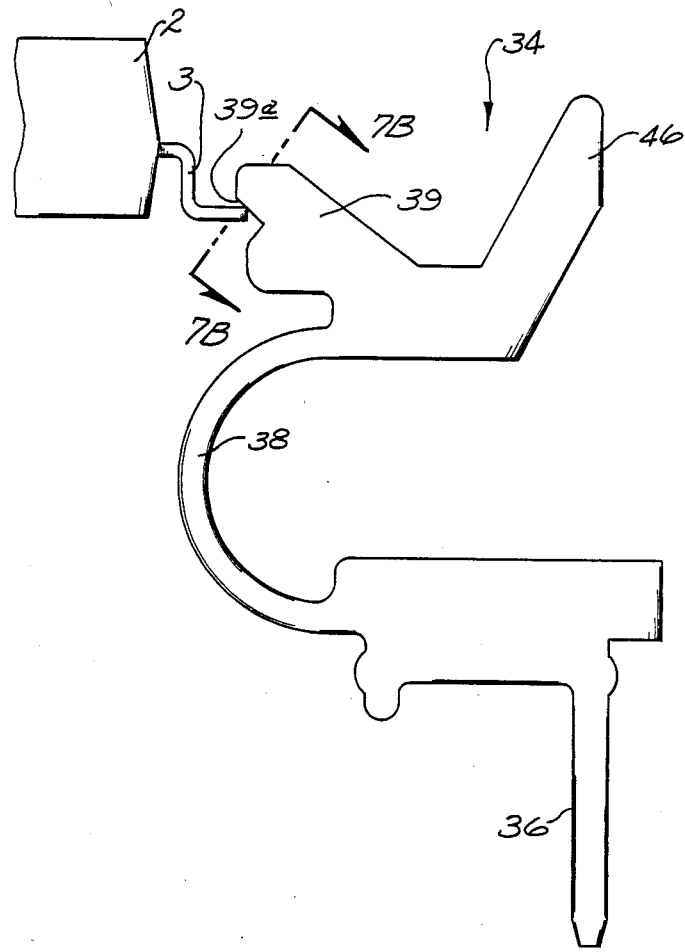
FIG. 7A is a schematic side elevation view similar to FIG. 1A illustrating the contact in the prior art socket of FIG. 1B.
Figure 7B:
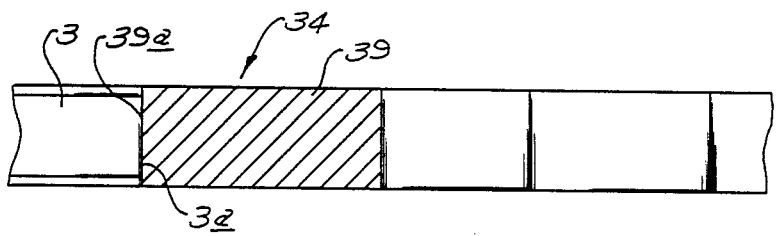
FIG. 7B is a partial section view along line 7B—7B of FIG. 7A.
Figure 8:
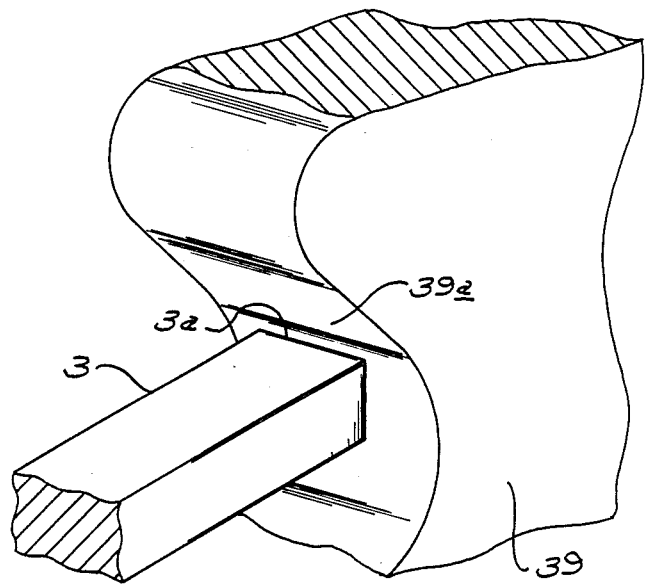
FIG. 8 is a partial perspective view to enlarged scale and partly in section illustrating operation of the contact shown in FIGS. 7A-7B.

FIGS. 7A-7B show the contact element 34. As shown, the surface of the compressive part 39 of the socket contact that engages the terminal or pin 3 of the IC chip on surface 39a is a plane. As is shown in an enlarged view in FIG. 8, one edge 3a of rectilinear or similar sharp configuration at the tip or distal end of the pin 3 of the IC chip 2 effects a linear contact with the contact surface 39a of the compressive part 39.

Figure 9:
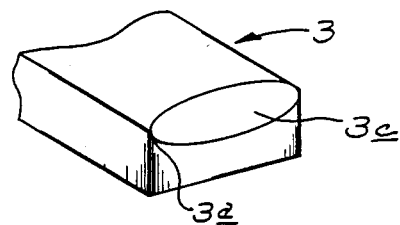
FIG. 9 is a partial perspective view similar to FIG. 3 illustrating a portion of a terminal of an IC chip after having been installed in a test socket of the prior art as shown in FIGS. 6-8.

When a heat resistant test is carried out by heating the noted contact-terminal engagement in this state, the range or area of the above contact is large such that tin plating as customarily provided on the pin 3 of the IC chip 2 tends to move and to adhere to the contact surface 39a of the compressive part 39 and, as it is oxidized, the reliability of the electrical connection with the pin 3 is lowered. In addition, the edge or tip of the pin 3 tends to be deformed as shown in FIG. 9 and a contact mark 3c is formed at that location.

The above-described problem can develop not only in the case of a socket used in the heat-resistance test in a repeated manner but also in the case of a socket installing electrical parts for a long period of time.

The present invention overcomes these difficulties and provides a highly reliable and durable socket with a secure electrical contact with IC chips or terminals of other electrical parts to be installed despite repeated usage or long-term usage.

That is, the socket of this invention relates to a socket constructed in such a manner that, as compared with the prescribed electrical parts to be installed, a contact element is placed in engagement with an IC chip terminal while in an elastically or resiliently compressed state so as to effect an electrical contact to the chip but is characterized in that plural contact points are provided on the contact surface of the plate contact elements so that the aforementioned contact elements may each effect contact with each chip terminal in the manner described but at a plurality of locations across the thickness direction of the plate contact element such that the line of engagement between the contact and chip terminal crosses the direction of the aforementioned compression 3c approximately at a right angle thereto.

That is, the socket of this invention provides improved contact-terminal engagement. Some examples of this invention being explained in FIGS. 1-4 which show sockets for the IC chip test as above described.

Figure 4:
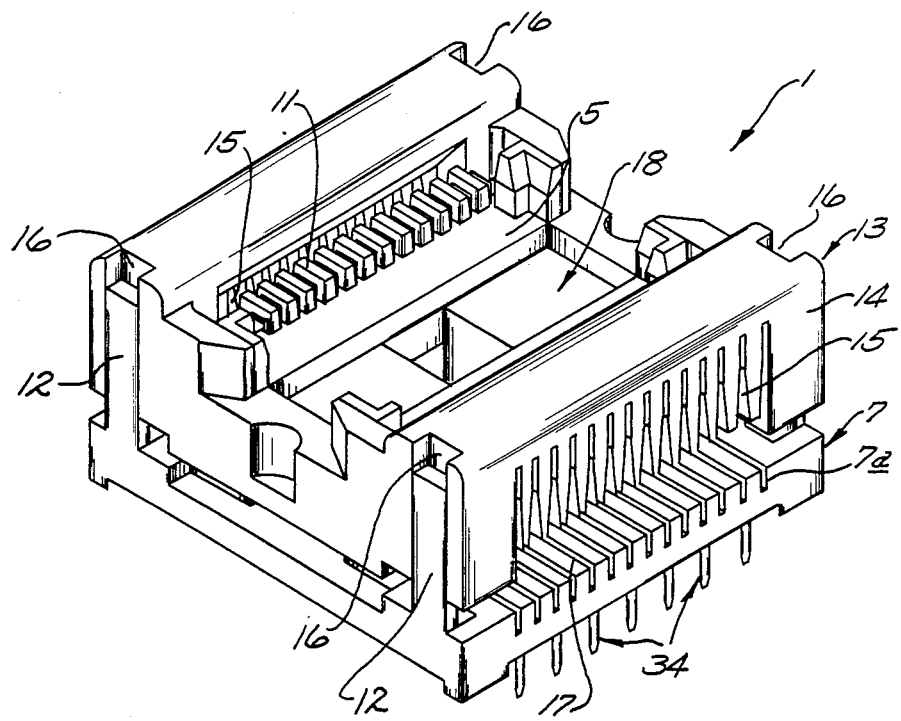
FIG. 4 is a perspective view of the socket of this invention.

FIG. 4 is an oblique view of the socket, wherein the socket 1 is composed of a main electrically insulating body 7 and a cover 13 that is engaged with the main body 7 from above. A large number of electrically conductive contact elements 34 are installed (14 on each side in this example) in the main body 7 as will be described later. The same number of oblong grooves 7a and cuts 15 as the contact elements are formed on the main body 7 and the side wall 14 of the cover 13 respectively and an empty space 17 is preferably formed between the main body 7 and the side wall 14 of the cover 13. Near the four corners of the main body 7, there is provided a cover guide 12 that is engaged with a guide groove 16 of the cover 13 wherein the guide groove 16 and the guide cover 12 guide each other so that the cover 13 may move up and down as compared with the main body 7.

On the main body 7, there is provided guide means 11 for guiding the pins of an IC chip onto a stand located on the main connector body so that the stand determines the vertical directional position or orientation of the IC chip 2 in the socket 1 for the purpose of accurately positioning the IC chip in connection with the installation of the IC chip as will be described later. See FIG. 2. In addition, the cover 13 does not have a canopy and there is formed a space 18 for the installation of the IC chip in the socket 1.

Figure 1B:
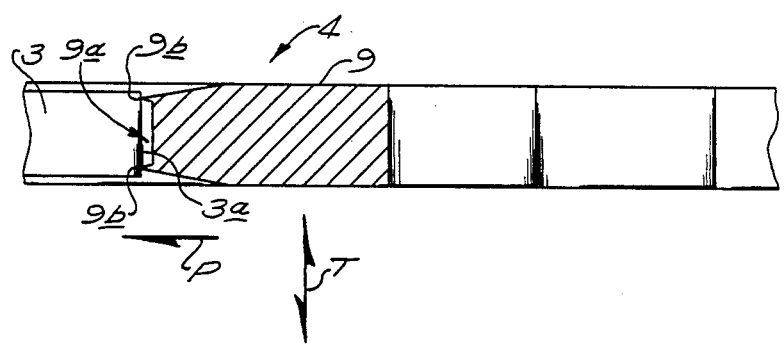
FIG. 1B is a partial section view to greatly enlarged scale along line 1B—1B of FIG. 1.

FIG. 1A shows a contact element according to this invention, schematically showing a side view of the same engaged with a chip terminal 3 and FIG. 1B showing an enlarged partial cross section of FIG. 1A cut along line 1B—1B.

The contact element 4 has an installation part 10 that is installed and secured on the main body 7, has an elastic or resilient curved part 8 that extends up from the installation part 10, has a compressive or engagement part 9, and has a trigger part 16 provided adjacent to the curved part 8.

On the installation part 10, further, there is provided one or more lead legs 6 that are to be inserted into and soldered inside the lead insertion holes of a print substrate that is to be connected with the test circuit (not shown in FIG. 1A), There are typically two kinds of contact elements 4, including those having a lead leg 6 provided on the right-hand side as shown by the solid line and others having a lead leg 6 on the left-hand side as shown by an imaginary line in the drawing. These are typically installed alternately on the main body 7 shown in FIG. 4.

The contact part 9a of the metal plate contact 4 which engages the terminal or pin 3 of the IC chip is stamped or formed by means of cold working or the like so, that as showning FIG. 1B, the edge of the contact is provided with a plurality of blade-like projections 9b and 9b which protrude from both sides of the edge adjacent the lateral sides of the contact 4 as shown in FIG. 1B. These blades 9b exist in the thickness direction T of the plate contact element such that they cross or move in direction of the compression applied to the chip terminal 3 by the contact 4 at approximately at a right angle to a sharp edge of a chip terminal as shown by the arrow mark P in FIG. 1A.

Figure 2:
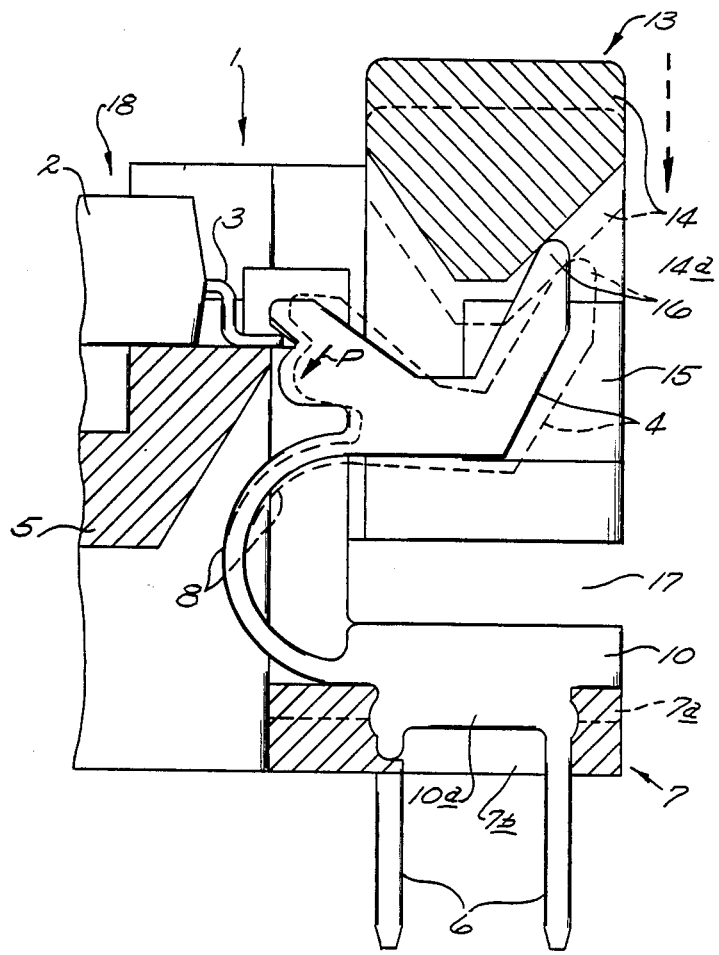
FIG. 2 is a partial section view similar to FIG. 1 along a vertical axis of the socket of this invention.

In that way, improved contact is made with the chip terminal. That is as shown in FIG. 2 which is a cross section showing the state of the installation of the IC chip 2 in the socket 1 when a protrusion 10a from the installation part 10 of the contact element 4 is inserted into the groove 7a of the main body 7, the lead leg 6 protrudes downward through an oblong through hole 7b in contact with the groove 7a and the contact element 4 is fixed to the main body 7.

When the IC chip 2 is then installed in the socket 1, the trigger part 16 of the contact element 4 is pushed down as indicated by a broken line by means of the inclined surface 14a at the lower end of the side wall 14 of the cover 13. The curved part 8 of the contact then undergoes an elastic deformation as indicated by the broken lines in FIG. 2 with a result that the compressive part 9 moves out from the space 18.

In the above state, the IC chip 2 is inserted into the space 18 and placed on the stand 5 as explained in connection with FIG. 6. At that time, the pin 3 of the IC chip 2 is guided by the guiding wall 11 and is accurately positioned vis-a-vis the compressive part 9 of the socket contacts.

Next, if the downward pushing of the trigger part 16 by means of the cover 13 is released, the contact part 9a of the compressive part 9 laterally presses the pin 3 of the IC chip 2 by the elasticity or resilience of the curved part 8, with a result that the IC chip 2 and the contact element 4 are connected electrically and the chip is detachably secured in the socket.

Since there are formed two blades 9b as described earlier at the contact part 9a of the compressive part 9, the blades 9b contact one of the edges at an end of the pin 3 at an oblique angle relative to the IC chip stand as seen in FIG. 2 and, when the compressive part 9 is observed in terms of its cross section as shown in FIG. 1(b), it can be seen that such compressive engagement contacts the edge 3a of the pin 3 at two points at the tip of the two blades 9b respectively. Accordingly, this contact area becomes markedly small and uniform as compared with the contact area with a linear cross section as in the case of the conventional socket. As a result of this, the tin plating of the pin is prevented from transferring to the compressive part 9 of the contact as described earlier, with a result that there is no possibility of the said adhered tin creating a contact failure by its oxidation.

In view of the fact that there are two contact engagement areas, further, the contact is more satisfactory as compared with a single-point contact and the contact resistance also becomes smaller, thereby making it more convenient.

Figure 3:
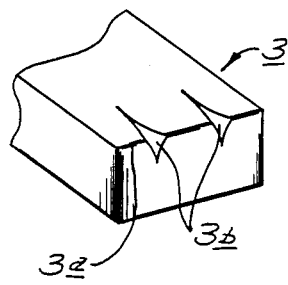
FIG. 3 is a partial perspective view to enlarged scale of a portion of a terminal of an IC chip after having been installed in a test socket.

On one of the edges 3a at the tip of the chip pin 3, further, the blade 9b of the compressive part 9 intrudes as shown in FIG. 3, with a result that contact marks 3b are formed at only two locations. Even if the tin-plated surface of the pin 3 may be oxidized, the intrusion of the blade 9b into the edge 3a at the end of the pin 3 results in the rupture of the oxidation film, thereby causing the metal inside the contact the blade 9b directly, making certain the electrical connection between the pin 3 and the compressive part 9.

In view of the above, even if the heat resistance test may be carried out repeatedly, the electrical connection between the pin 3 and contact element 4 is certain, with a result that the reliability and durability are markedly improved as compared with the conventional sockets.

In order to exchange the IC chip on which the test has been completed with the IC chip that is to be used in the next test, the cover 13 is pushed down until the state shown by the broken line in FIG. 2 is achieved, the IC chip 2 is removed from the space 18, followed by the installation of the next IC chip in the socket 1 as described earlier. In this manner, both the installation and removal of the IC chip are carried out easily.

Figure 5:
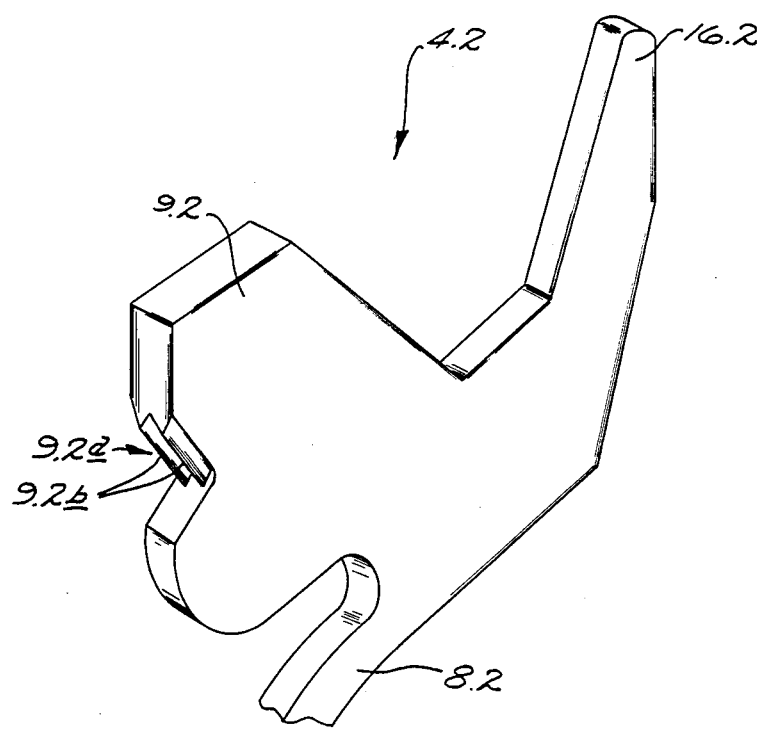
FIG. 5 is a partial perspective view to enlarged scale of the contact used in the socket of FIG. 4.

FIG. 5 is an enlarged partial cross section illustrating an alternate embodiment of the contact of this invention as shown by contact element 4.2. In FIG. 5, 8.2 indicates an elastic curved part, 9.2 is a compressive part, and 16.2 is a trigger part. At the contact part 9.2a of the compressive part 9.2, blades 9.2b are formed like hills by machining or cold forming or working, thereby forming two blades 9.2b and 9.2b whose cross section is generally triangular. Blades 9.2b and 9.2b contact the end of the pin of the IC chip which is not shown in the drawing, with a result that the contact element and the IC chip are reliably connected electrically.

In addition to the aforementioned examples, various other modifications are possible on the basis of the technical concept of this invention. For example, three or more blades 9b or 9.2b may be installed. In addition, a large number of contact elements may be provided around four sides of the recess 18 and an IC chip may be employed having a large number of pins provided on the four sides thereof. Alternately, the pins of the IC chip may be in the shape of J in addition to the Z-shape or they can assume some other shape and the shape of the blades 9b on the contact parts can be made such as to cope with the alternate shapes of the pin.

Moreover, the socket may be used not only in the heat resistance test of the IC chip but also as a socket to be arranged in various electrical machines and apparatus. In such a case, there will be no contact failure due to the oxidation of the tin plating, etc., displaying a highly satisfactory result in terms of reliability and durability. In addition, the electrical parts to be provided can be other electrical parts other than IC chip.

According to the socket of this invention, the contact element is made to contact the electrical parts at a plurality of locations spaced in the thickness direction of a plate contact element. In that way, there are plural contact projections extending in direction in which the contact element compresses a terminal or pin of an electrical component so that the projections cut into an edge of the terminal approximately at a right angle to the direction of the extension of the terminal edge. Accordingly, three take place contact at a plurality of locations as described above due to the plural contact blades provided on the contact surface of the contact element and there is little liklihood of coating or plating materials on the contact area moving over to the contact element such that oxidation of the materials can cause contact failure, with result that both reliability and durability are improved.

By way of summary, according to the invention, a test socket for detachably mounting and electrically connecting a terminal of an integrated circuit unit in a test circuit comprises an electrically insulating body having an opening extending through the body between a top and a bottom of the body. A cover with a central opening is mounted at the top of the body for selective movement between first and second cover positions and a contact of a flat, resilient electrically conductive metal material is disposed in the body opening. The contact has a post part extending from the body opening at the bottom of the body to be connected in a test circuit, a resilient curved part extending in a plane from the opening at the top of the body, and a compressive part at an extended end of said curved part. The compressive part has an edge to be resiliently engaged with a coated terminal of an integrated circuit unit mounted at the top of the body within the cover opening while the cover is in the first cover position for retaining the integrated circuit unit on the body with the terminal electrically connected to the contact. The contact has a trigger part engageable by the cover for moving the curved part of the contact in said plane to move said edge out of engagement with the terminal and release the integrated circuit unit when the cover is moved into the second cover position. The contact has a plurality of blade elements formed in side-by-side relation to each other in said edge of the compressive part having cutting edges extending parallel to said plane to be embedded in a coating on said terminal for providing improved electrical engagement between the contact and terminal and for permitting the contact to move out of said engagement with the terminal with improved reliability substantially free of said coating when the cover is moved to said second position.

I claim:

1. A socket comprising a main body having an area including a stand for receiving an integrated circuit unit having circumferentially arranged unit terminals thereon to dispose the unit terminals at locations around the area, the stand having a surface to determine the selected orientation of the integrated circuit unit, the terminals having a sharp edge at their distal ends, a plurality of electrically conductive contact elements of a plate configuration mounted on the main body around the area for connecting the unit terminals in an electrical circuit, each element having a leg part for mounting the element on the body, a contact part at an edge of the plate configuration for engaging a respective unit terminal, a resilient curved part intermediate the contact and leg parts normally biasing the contact part to engage a terminal of a unit received on the area for making detachable electrical connection thereto, and a compressive part to be depressed for resiliently withdrawing the contact part from engagement with such a unit terminal, and a cover with an opening therein mounted on the body for movement between a depressed position engaging the compressive parts of the contact elements for withdrawing the contact parts from engagement with unit terminals to permit insertion and withdrawal of an integrated circuit unit relative to the area via the opening and a raised position permitting the contact parts of the elements to resiliently engage respective unit terminals for electrically connecting the terminals in an electrical circuit, characterized in that each contact element has a plurality of projections formed side-by-side in an edge of the plate configuration at the contact part of the element for improving electrical connection to the unit terminal, the projections comprising blade-like portions of the elements disposed in side-by-side parallel relation to each other in the edge of the plate-like configuration of the contact element at the contact part, the blade-like portions disposed at an oblique angle relative to the said surface of the stand when the cover is in the raised position so that the blade-like portions engage the sharp edge of the distal end of an engaged unit terminal to tend to penetrate a surface of the engaged unit terminal.

2. A socket according to claim 1 further characterized in that the main body area is arranged to receive an integrated circuit unit having unit terminals with rectilinear terminal edges at tips thereof so that said rectilinear layer of the terminal are disposed at a selected location relative to the contact elements when the unit is received at said area, and in that the contact elements have configurations disposing said blade-like projections to penetrate the terminal tips of said rectilinear edges to facilitate detachable electrical connection to such terminals where malleable coating materials are provided on the terminals.

* * * * *